US012676284B2

(12) United States Patent
Yoshida et al.

(10) Patent No.: US 12,676,284 B2
(45) Date of Patent: Jul. 7, 2026

(54) DEFECT INSPECTION APPARATUS

(71) Applicant: Hitachi High-Tech Corporation,
Tokyo (JP)

(72) Inventors: Yasuhiro Yoshida, Tokyo (JP);
Masayoshi Ishikawa, Tokyo (JP);
Toshinori Yamauchi, Tokyo (JP);
Kosuke Fukuda, Tokyo (JP); **Hiroyuki
Shindo,** Tokyo (JP)

(73) Assignee: Hitachi High-Tech Corporation,
Tokyo (JP)

( * ) Notice: Subject to any disclaimer, the term of this
patent is extended or adjusted under 35
U.S.C. 154(b) by 394 days.

(21) Appl. No.: 18/318,300

(22) Filed: May 16, 2023

(65) Prior Publication Data

US 2023/0402249 A1 Dec. 14, 2023

(30) Foreign Application Priority Data

Jun. 13, 2022 (JP) ................................. 2022-094797

(51) Int. Cl.
*H01J 37/22* (2006.01)
*G06T 7/00* (2017.01)
*H01J 37/28* (2006.01)
(52) U.S. Cl.
CPC ............ *H01J 37/222* (2013.01); *G06T 7/001*
(2013.01); *H01J 37/28* (2013.01); *G06T*
*2207/20081* (2013.01); *H01J 2237/221*
(2013.01); *H01J 2237/2817* (2013.01)
(58) Field of Classification Search
USPC .......... 216/2–109; 382/100–275; 438/1–982;
706/1–62, 900–912; 850/1–52
See application file for complete search history.

(56) References Cited

U.S. PATENT DOCUMENTS

| | | | | |
|---|---|---|---|---|
| 11,189,058 B2 * | 11/2021 | Kubo | ..................... | G06N 20/00 |
| 2005/0146714 A1 | 7/2005 | Kitamura et al. | | |
| 2019/0073566 A1 | 3/2019 | Brauer | | |
| 2019/0147586 A1 * | 5/2019 | Ikeda | ................... | G06T 7/0004 |
| | | | | 382/157 |

(Continued)

FOREIGN PATENT DOCUMENTS

| | | |
|---|---|---|
| CN | 110766660 A | 2/2020 |
| JP | 2018-005640 A | 1/2018 |

(Continued)

OTHER PUBLICATIONS

Ko Sung Jea; Method for Image Denoising Using Parallel Feature
Pyramid Network, Recording Medium and Device for Performing
the Method; 2021 (Year: 2021).*

(Continued)

*Primary Examiner* — Marcellus J Augustin
(74) *Attorney, Agent, or Firm* — Volpe Koenig

(57) ABSTRACT

A defect inspection apparatus includes: a feature value
calculation unit calculating a feature value based on a
captured image of a sample; an image information reduction
unit generating a latent variable by reducing an information
quantity of the feature value; a statistic value estimation unit
estimating an image statistic value that can be taken by a
normal image based on the latent variable; and a defect
detection unit detecting a defect in an inspection image
based on the image statistic value and the inspection image
of the sample.

14 Claims, 10 Drawing Sheets

(56) References Cited

U.S. PATENT DOCUMENTS

| | | | |
|---|---|---|---|
| 2019/0362490 A1* | 11/2019 | Wen | G06T 7/0004 |
| 2020/0273210 A1 | 8/2020 | Nguyen et al. | |
| 2022/0318975 A1 | 10/2022 | Ouchi et al. | |
| 2022/0414833 A1* | 12/2022 | Fukuda | G06T 5/70 |

FOREIGN PATENT DOCUMENTS

| | | |
|---|---|---|
| JP | 2021-144314 A | 9/2021 |
| TW | I336778 B | 2/2011 |
| TW | 202103110 A | 1/2021 |
| TW | I751375 B | 1/2022 |
| WO | 2020/250373 A1 | 12/2020 |

OTHER PUBLICATIONS

Hiroi Takashi; Defect Inspection Method and Defect Inspection Device; 2021 (Year: 2021).*
Kondo, Naoaki; Sample Observation System and Image Processing Method; 2021 (Year: 2021).*
Defect Inspection Method and Defect Inspection Device (Year: 2021).*
Sample Observation System and Image Processing Method (Year: 2021).*
Korean Office Action issued on May 29, 2025 for Korean Patent Application No. 10-2023-0064151.
Taiwan Office Action issued on Sep. 5, 2024 for Taiwan Patent Application No. 112118519.
Japanese Office Action issued on Sep. 2, 2025 for Japanese Patent Application No. 2022-094797.

* cited by examiner 301         302         303

S101, S102        S103, S104

LEARNING IMAGE     DISCRETIZED IMAGE     IMAGE STATISTIC VALUE

MINIMIZE DIFFERENCE
(S106)

10

MODEL PARAMETER

2

INSPECTION IMAGE

11

FEATURE VALUE CALCULATION UNIT

12

IMAGE INFORMATION REDUCTION CONTROL UNIT

13

STATISTIC VALUE ESTIMATION UNIT

14

DEFECT DETECTION UNIT

15

DETECTION RESULT 401        402

IMAGE STATISTIC VALUE ESTIMATION

INSPECTION IMAGE     IMAGE STATISTIC VALUE

Figure 10:
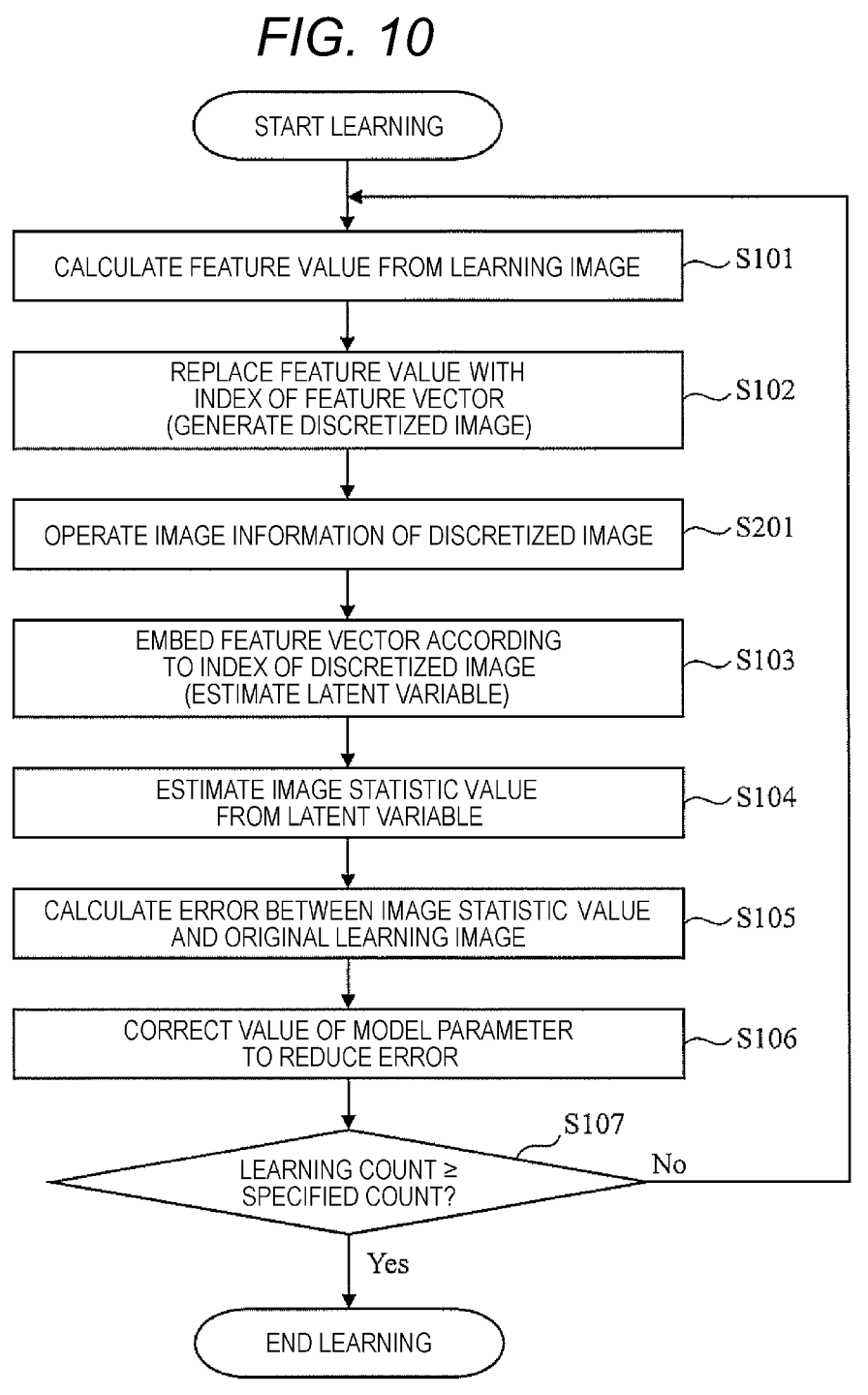

```
          ┌─────────────────────┐
          │   START LEARNING    │
          └─────────────────────┘
                     │
                     ▼◄──────────────────────────┐
   ┌──────────────────────────────────────────┐  │
   │ CALCULATE FEATURE VALUE FROM LEARNING IMAGE│─┼─ S101
   └──────────────────────────────────────────┘  │
                     │                            │
                     ▼                            │
   ┌──────────────────────────────────────────┐  │
   │        REPLACE FEATURE VALUE WITH          │  │
   │         INDEX OF FEATURE VECTOR            │──┼─ S102
   │       (GENERATE DISCRETIZED IMAGE)         │  │
   └──────────────────────────────────────────┘  │
                     │                            │
                     ▼                            │
   ┌──────────────────────────────────────────┐  │
   │ OPERATE IMAGE INFORMATION OF DISCRETIZED IMAGE │─ S201
   └──────────────────────────────────────────┘  │
                     │                            │
                     ▼                            │
   ┌──────────────────────────────────────────┐  │
   │      EMBED FEATURE VECTOR ACCORDING        │  │
   │       TO INDEX OF DISCRETIZED IMAGE        │──┼─ S103
   │        (ESTIMATE LATENT VARIABLE)          │  │
   └──────────────────────────────────────────┘  │
                     │                            │
                     ▼                            │
   ┌──────────────────────────────────────────┐  │
   │       ESTIMATE IMAGE STATISTIC VALUE       │──┼─ S104
   │           FROM LATENT VARIABLE             │  │
   └──────────────────────────────────────────┘  │
                     │                            │
                     ▼                            │
   ┌──────────────────────────────────────────┐  │
   │ CALCULATE ERROR BETWEEN IMAGE STATISTIC VALUE │─ S105
   │        AND ORIGINAL LEARNING IMAGE         │  │
   └──────────────────────────────────────────┘  │
                     │                            │
                     ▼                            │
   ┌──────────────────────────────────────────┐  │
   │      CORRECT VALUE OF MODEL PARAMETER      │──┼─ S106
   │             TO REDUCE ERROR                │  │
   └──────────────────────────────────────────┘  │
                     │                            │
                     ▼           S107             │
                  ╱──────────────╲      No        │
                 ╱ LEARNING COUNT ≥ ╲─────────────┘
                 ╲ SPECIFIED COUNT? ╱
                  ╲────────────────╱
                     │
                    Yes
                     ▼
          ┌─────────────────────┐
          │    END LEARNING     │
          └─────────────────────┘
```

NORMAL IMAGE          DISCRETIZED IMAGE          DISCRETIZED IMAGE          PSEUDO DEFECT IMAGE
                                                 (AFTER OPERATION)

MINIMIZE DIFFERENCE

DEFECT INSPECTION APPARATUS

BACKGROUND OF THE INVENTION

1. Field of the Invention

The present invention relates to a defect inspection apparatus such as an apparatus for image-based defect or contamination inspection.

2. Description of Related Art

A scanning electron microscope (SEM) image captured with an SEM is used for semiconductor inspection. Existing inspection methods include die-to-database inspection for detecting a defect by comparing semiconductor circuit design data with a SEM image. However, with the miniaturization of semiconductor circuit patterns, it is becoming difficult to form circuit patterns as designed on wafers, leading to circuit manufacturing errors. Accordingly, misdetection arises from noise or a manufacturing error in pixel comparison-based die-to-database inspection, limiting inspection performance improvement.

Therefore, WO2020/250373 pamphlet discloses a technique for predicting, from the design data, the probability distribution of a luminance value that a normal circuit pattern can take from a reference image such as design data and determining a region of an inspection image with a luminance value deviating from the luminance value probability distribution as a defect.

Although distribution comparison enables robust inspection against minute manufacturing errors and noise, estimation of distribution requires design data in WO2020/250373 pamphlet. Therefore, the technique of WO2020/250373 pamphlet cannot be applied in a case where design data cannot be used during inspection.

Design data-free inspection methods include die-to-die inspection for detecting a defect by comparing an inspection image with a reference image that is an image of a point different from the inspection image and has the same shape as the inspection image. However, die-to-die inspection as well as die-to-database inspection is noise-vulnerable for pixel comparison and limited in inspection performance improvement. A semiconductor device including an undetected defect may become a defective product in another inspection conducted during a final test or the like, and a decline in yield may arise.

SUMMARY OF THE INVENTION

An object of the invention is to provide a defect inspection apparatus robust against noise and manufacturing errors without using design data during inspection.

An example of a defect inspection apparatus according to the invention includes:

a feature value calculation unit calculating a feature value based on a captured image of a sample;

an image information reduction unit generating a latent variable by reducing an information quantity of the feature value;

a statistic value estimation unit estimating an image statistic value that can be taken by a normal image based on the latent variable; and a defect detection unit detecting a defect in an inspection image based on the image statistic value and the inspection image of the sample.

The defect inspection apparatus according to the invention is capable of performing inspection robust against noise and manufacturing errors without using design data during the inspection.

BRIEF DESCRIPTION OF THE DRAWINGS

FIG. 9 is a configuration diagram of an image information reduction unit for creating pseudo defect according to Example 3;

FIG. 10 is a diagram illustrating a processing flow of the model parameter learning according to Example 3;

DESCRIPTION OF EMBODIMENTS

Hereinafter, embodiments of the invention will be described with reference to the accompanying drawings.

Example 1

Figure 1:
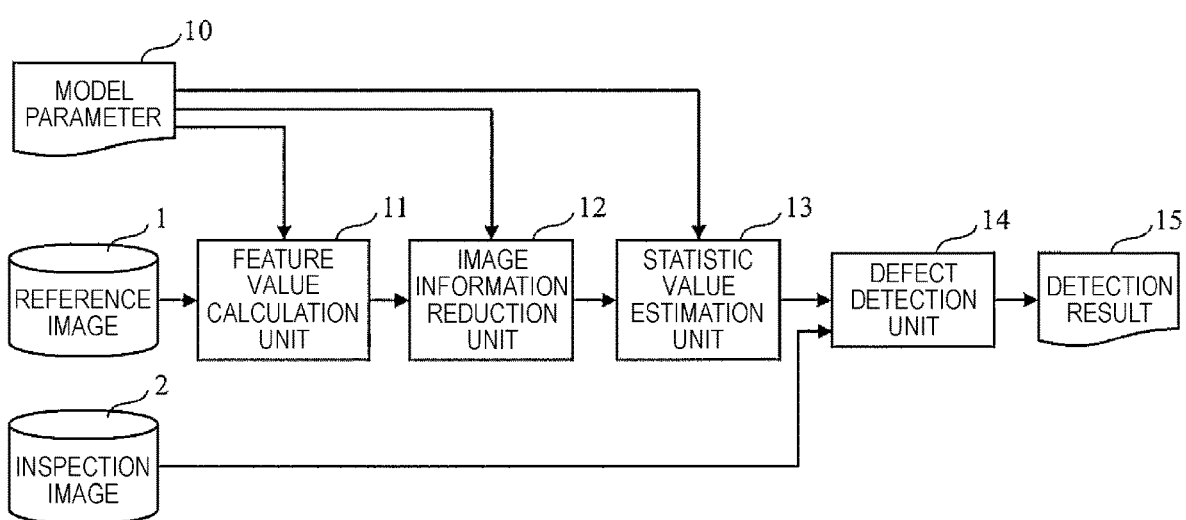
FIG. 1 is a configuration diagram of a defect inspection apparatus according to Example 1 of the invention.

A defect inspection apparatus according to Example 1 of the invention will be described with reference to FIG. 1. FIG. 1 is a configuration diagram of the defect inspection apparatus according to Example 1. The defect inspection apparatus can be configured using, for example, a known computer and includes computing means and storage means. The computing means includes, for example, a processor. The storage means includes, for example, storage media such as a semiconductor memory device and a magnetic disk device. Some or all of the storage media may be non-transitory storage media.

The defect inspection apparatus may include input/output means. The input/output means includes, for example, an input device such as a keyboard and a mouse, an output device such as a display and a printer, and a communication device such as a network interface.

The storage means may store programs. The computer may execute the functions to be described in the example by the processor executing the programs. In other words, the programs may cause the computer to function as the defect inspection apparatus.

The storage means of the defect inspection apparatus stores a reference image 1, an inspection image 2, and a detection result 15. Each of the reference image 1 and the inspection image 2 is a captured image in which a specific point of a sample is imaged. In the example, the reference image 1 and the inspection image 2 are preferably images of different points mutually identical or similar in shape.

A feature value calculation unit 11, an image information reduction unit 12, a statistic value estimation unit 13, and a defect detection unit 14 are configured by cooperation of the computing means and the storage means of the defect inspection apparatus. The feature value calculation unit 11, the image information reduction unit 12, and the statistic value estimation unit 13 are trained models with parameters learned by machine learning. The parameters are stored as model parameters 10 in the storage means of the defect inspection apparatus.

The feature value calculation unit 11 calculates a feature value based on the reference image 1. The feature value calculation unit 11 is capable of using, for example, an encoder in a convolutional neural network (CNN). Although a feature value includes a plurality of components and the specific format of the feature value can be designed in any manner, the feature value in the example is a third-order tensor with a size of a*b*c. Each component of the feature value is, for example, a real number of 0 or more and 1 or less.

Figure 2:
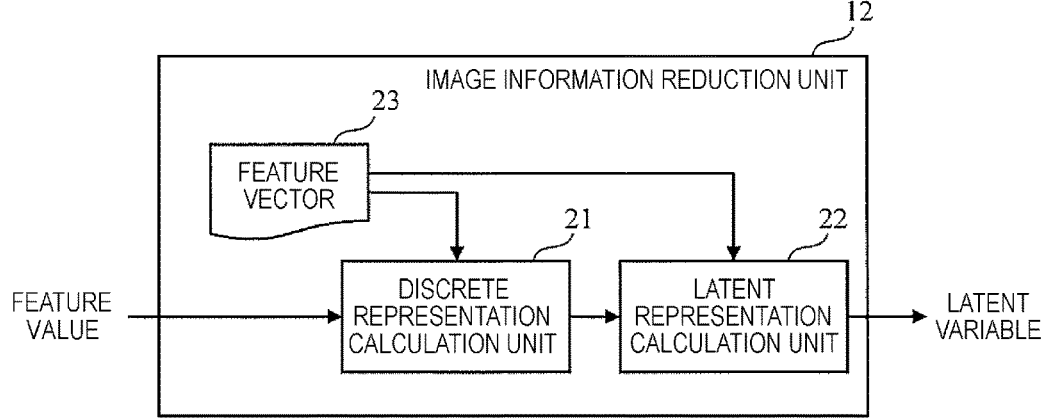
FIG. 2 is a configuration diagram of an image information reduction unit according to Example 1.

The image information reduction unit 12 reduces the information quantity of the feature value calculated by the feature value calculation unit 11. The configuration of the image information reduction unit 12 is illustrated in FIG. 2. The image information reduction unit 12 includes a discrete representation calculation unit 21 and a latent representation calculation unit 22 and stores a plurality of feature vectors 23. The feature vectors 23 are assigned indices for identifying each. The indices are represented by discrete representations (for example, integers).

The feature vector 23 is a quantity including a plurality of components (however, the component count of the feature vector does not exceed the component count of the feature value). In the example, the feature vector is an a-dimensional vector, that is, the component count is a. Each component of the feature vector is, for example, a real number of 0 or more and 1 or less.

The discrete representation calculation unit 21 searches the feature vectors 23 for one with a similar value as to at least part of the input feature value and replaces the feature value with the index value of the feature vector.

In the example, a feature value with a size of a*b*c is divided into b*c numbers of a-dimensional vector parts. For each vector part, one feature vector 23 (for example, the most similar feature vector) is selected out of the plurality of feature vectors 23 that are candidates based on the values of the components of the vector part. Then, the vector part is replaced with the index of the selected feature vector 23.

Hereinafter in the specification, an image in which a feature value is replaced with an index value as such will be referred to as a "discretized image". The discretized image can be represented as a quantity with b*c numbers of indices.

The latent representation calculation unit 22 embeds the feature vector 23 corresponding to each index as to the discretized image. Hereinafter in the specification, the discretized image in which the feature vector 23 is embedded will be referred to as "latent variable". The latent variable is a tensor with the same size as the original feature value.

As such, the image information reduction unit 12 generates a latent variable by reducing the information quantity of a feature value. In particular, the image information reduction unit 12 reduces the information quantity of a feature value by replacing at least part of the feature value with an index (discrete representation) related to at least one of the plurality of feature vectors 23. As such, processing for information quantity reduction can be implemented specifically. Note that specific processing for information quantity reduction is not limited to the example described above and can be appropriately designed by those skilled in the art.

The statistic value estimation unit 13 estimates an image statistic value that can be taken by a normal image based on the latent variable. The statistic value estimation unit 13 can be configured using, for example, a decoder in a CNN. In the example, the image statistic value is represented by the probability distribution of the luminance value for each pixel. The luminance value probability distribution can be represented by, for example, a Gaussian distribution, and one Gaussian distribution is defined for each pixel. A Gaussian distribution can be specified by, for example, the mean and standard deviation associated with the Gaussian distribution. Hereinafter in the specification, the luminance value probability distribution may be referred to as "luminance value distribution".

Here, each of the feature value calculation unit 11, the image information reduction unit 12, and the statistic value estimation unit 13 uses the model parameters 10 to execute the above processing. In a case where the feature value calculation unit 11 and the statistic value estimation unit 13 are respectively an encoder and a decoder in a CNN, the model parameters 10 input to the feature value calculation unit 11 and the statistic value estimation unit 13 include a neural network weight. The model parameters 10 input to the image information reduction unit 12 include the index and value of the feature vector 23.

The defect detection unit 14 detects a defect in the inspection image 2 based on the image statistic value estimated by the statistic value estimation unit 13 and the inspection image 2. For example, it is determined whether the luminance value of each pixel of the inspection image 2 is within a predetermined normal range related to the luminance value distribution estimated by the statistic value estimation unit 13. Then, a region in the inspection image 2 that has a pixel out of the normal range in luminance value is detected as a defect and the detection result 15 is output to a user.

A method for calculating the model parameters 10 described above will be described using the learning flow of FIG. 4 together with the configuration diagram of FIG. 3.

Figure 3:
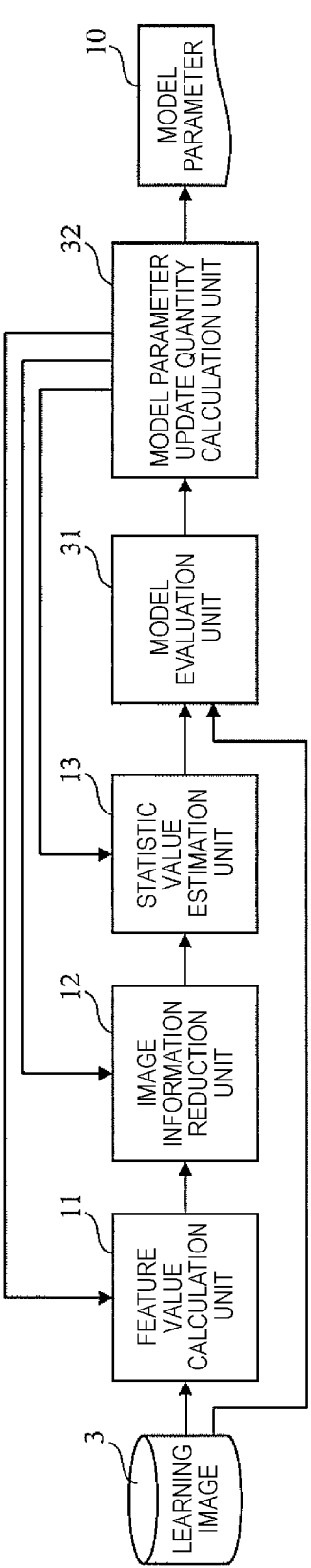
FIG. 3 is a configuration diagram of model parameter learning according to Example 1.
Figure 4:
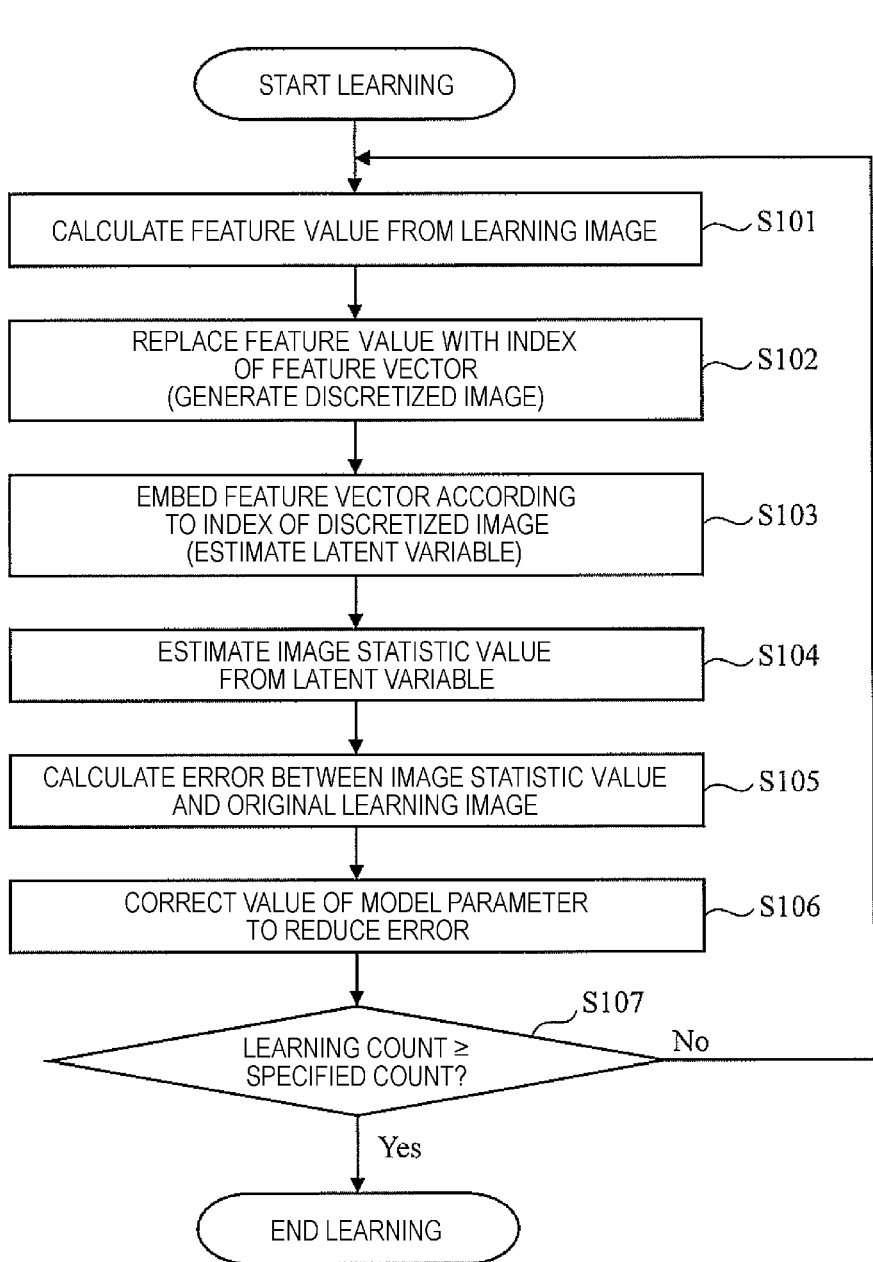
FIG. 4 is a diagram illustrating a processing flow of the model parameter learning according to Example 1.

In FIG. 3, a learning image 3 is a captured image (for example, SEM image) in which any point on a wafer is imaged. In the example, as to the learning image 3 in which a sample defect may or may not be present, feature value calculation (S101) by the feature value calculation unit 11, replacement of the index of the feature vector 23 (S102) and feature vector embedding (S103) by the image information reduction unit 12, and luminance value distribution estimation (S104) by the statistic value estimation unit 13 are performed as described above with reference to FIG. 1.

The error between the estimated luminance value distribution and the learning image 3 is calculated by a model evaluation unit 31 (S105). In other words, the model evaluation unit 31 performs error evaluation based on the image statistic value estimated based on the learning image 3 and the original learning image 3. For example, for each pixel, a predetermined comparison target value (for example, mean value of Gaussian distribution) can be calculated from the estimated image statistic value, and the difference between the comparison target value and the luminance value of the corresponding pixel in the learning image 3 can be calculated as a pixel-specific error. Then, the sum of the absolute values of the pixel-specific errors or the sum of the squares of the pixel-specific errors can be regarded as the error between the estimated luminance value distribution and the learning image 3.

A model parameter update quantity calculation unit 32 calculates a model parameter update quantity to reduce the obtained error (S106). In other words, the model parameter update quantity calculation unit 32 calculates the update quantities of the model parameters of the feature value calculation unit 11, the image information reduction unit 12, and the statistic value estimation unit 13 based on the obtained error. A stochastic gradient descent method as an example can be used for the update quantity calculation. The processing from S101 to S106 is repeated until reaching a specified count set in advance (S107).

Figure 5:
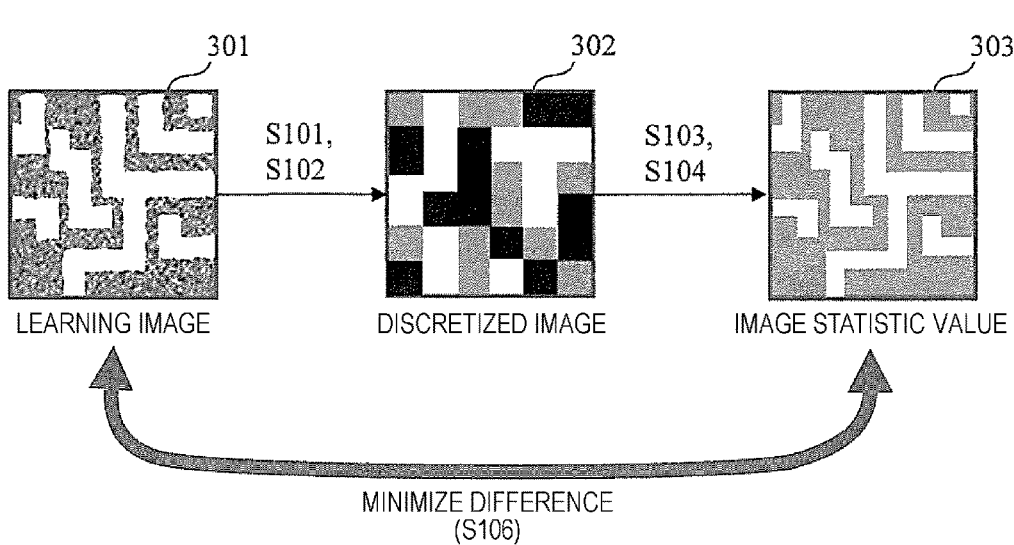
FIG. 5 is a schematic diagram illustrating an image generated in each step of the model parameter learning according to Example 1.

A schematic representation of the image generated in each step of the learning processing is illustrated in FIG. 5. In a learning image 301, semiconductor circuit parts are illustrated in white. The learning image 301 includes circuit distortion or noise attributable to an intra-image manufacturing error, which causes a decline in defect detection performance.

Feature value calculation is performed as to the learning image 301 (S101), and the index of the feature vector 23 is replaced (S102). An information quantity-reduced discretized image 302 (illustrated conceptually) is generated as a result. As to the discretized image 302, an image statistic value 303 is estimated by feature vector embedding (S103) and image statistic value estimation (S104). Note that the image statistic value 303 in FIG. 5 indicates the mean of the estimated luminance value distributions of the respective pixels.

For each learning image 301, learning is performed to reduce the difference between the image statistic value 303 and the learning image 301. As a result, it is possible to search for the error-minimizing model parameter 10 and estimate a plausible luminance value distribution according to the circuit pattern included in the learning image.

The effects of the example will be described. In the example, a method for replacing an intra-image feature value with a feature vector and estimating a luminance value distribution from a post-replacement latent variable has been described. In the replacement, a plurality of feature vector candidates are prepared and one feature vector selected out of the candidates replaces part of the feature value (in the example, the replacement processing is repeated b*c times). By adjusting the number of prepared feature vector candidates, it is possible to control the information quantity of the latent variable used for the luminance value distribution estimation.

For example, by setting a small feature vector candidate count, the image information reduction unit 12 is capable of deleting intra-image noise and manufacturing error-related information from the feature value and restoring only a circuit pattern feature common to learning images as illustrated in FIG. 5. As a result, it is possible to estimate, for each pixel, the probability distribution of a luminance value that can be taken by a normal circuit image in which manufacturing error and noise information is excluded from a reference image. By determining a region of an inspection image with a luminance value deviating from the probability distribution as a defect, defect inspection can be robust against noise and manufacturing errors. The number of feature vectors may be designated from the outside or may be automatically retrieved by optimization calculation for inspection performance maximization.

As such, the defect inspection apparatus according to the example is capable of performing robust inspection against noise and manufacturing errors without using design data during the inspection.

Example 2

Figure 6:
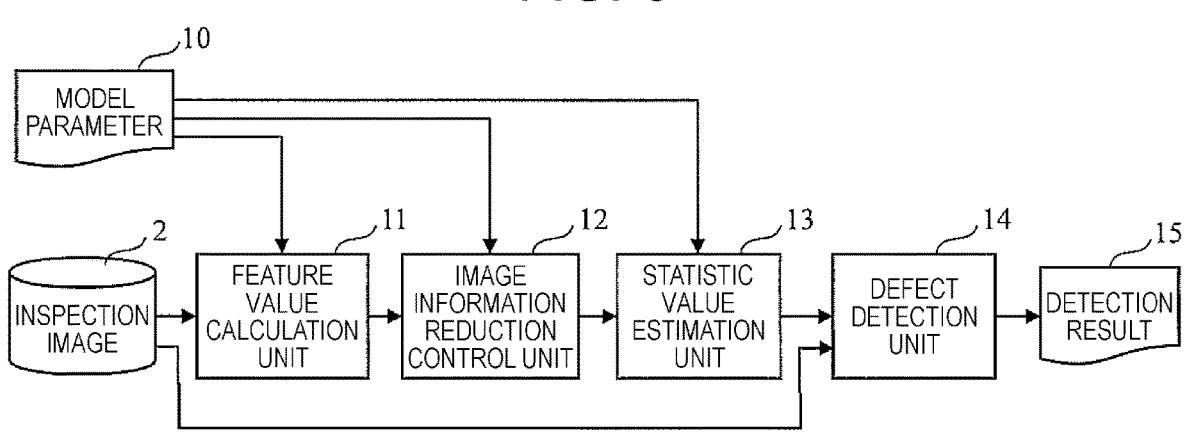
FIG. 6 is a configuration diagram of defect inspection according to Example 2 of the invention.

Hereinafter, a defect inspection apparatus according to Example 2 of the invention will be described with reference to FIG. 6. In the following, description of parts common to Example 1 may be omitted.

Example 1 and Example 2 differ from each other in that the reference image 1 is used in Example 1 and not used in Example 2. In Example 2, a defect in the original inspection image 2 is detected by comparison with the luminance value distribution estimated via the feature value calculation unit 11, the image information reduction unit 12, and the statistic value estimation unit 13 from the inspection image 2 itself. In other words, in Example 2, the inspection image 2 is a captured image that is a feature value calculation target.

In Example 2, the statistic value estimation unit 13 uses the latent variable calculated by the image information reduction unit 12 to estimate a luminance value distribution in which a region with a sample defect in the inspection image 2 is restored as if the region were a normal region. By comparing the luminance value distribution generated as such with the inspection image, defect inspection is performed using only the inspection image as an input.

An example of a method for learning how the statistic value estimation unit 13 estimates a luminance value distribution in which a defective region is restored as if the region were a normal region will be described below. In a case where the feature value calculation unit 11 and the statistic value estimation unit 13 are respectively an encoder and a decoder in a CNN, it is possible to make surrounding features usable for luminance value distribution estimation by designing a large number of CNN layers to widen the receptive field. Such a configuration is effective for, for example, a circuit pattern in which the same pattern is repeatedly arranged.

The effects of the example will be described. In the example, inspection by the self-referencing of the inspection image 2 eliminates the need for reference images, and thus the time required to capture a reference image can be reduced and inspection throughput improvement is possible.

By the self-referencing of the inspection image 2, it is possible to inspect defects without being affected by fluctuations in image quality-related information (such as intra-image distortion, luminance unevenness, and defocusing) causing a decline in performance in the die-to-die and die-to-database inspections of the related art. In other words, the image information reduction unit 12 does not delete information related to intra-image distortion, luminance unevenness, or defocusing from the feature value.

Figure 7:
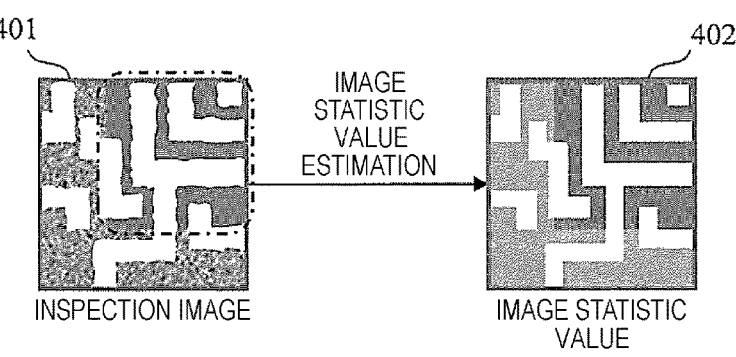
FIG. 7 is a schematic diagram illustrating an estimated luminance value distribution according to Example 2.

FIG. 7 illustrates a schematic representation of the inspection image and a luminance value distribution that is an image statistic value. In case of intra-image luminance unevenness in the upper right of an inspection image 401 (region indicated by a dotted line), it is possible to leave an image quality fluctuation-related feature while excluding noise and manufacturing error information in the luminance value distribution estimated via the feature value calculation unit 11, the image information reduction unit 12, and the statistic value estimation unit 13 from the inspection image 401 (mean value example is illustrated as an image statistic value 402). By inspection in which the luminance value distribution is compared with the inspection image, defects can be inspected without being affected by image quality fluctuations in the inspection image.

Example 3

Figure 8:
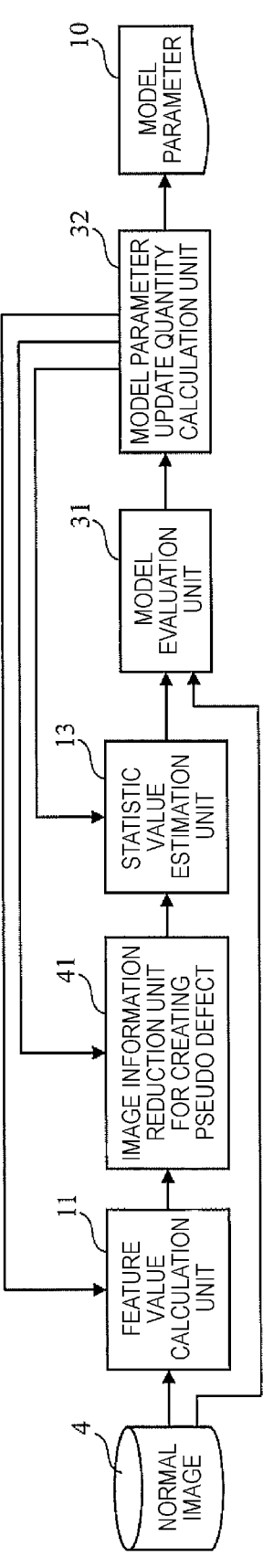
FIG. 8 is a configuration diagram of model parameter learning according to Example 3 of the invention.

Hereinafter, a defect inspection apparatus according to Example 3 of the invention will be described with reference to FIG. 8. In the following, description of parts common to Example 1 may be omitted.

Example 1 and Example 3 differ from each other in that the SEM image (learning image 3) used for learning is not limited to a normal image in Example 1 (FIG. 3) and the image is limited to a sample defect-free normal image 4 in Example 3. In Example 3, the image information reduction unit 12 (FIG. 2) in the model parameter learning processing is replaced with an image information reduction unit 41 for creating pseudo defect.

Figure 9:
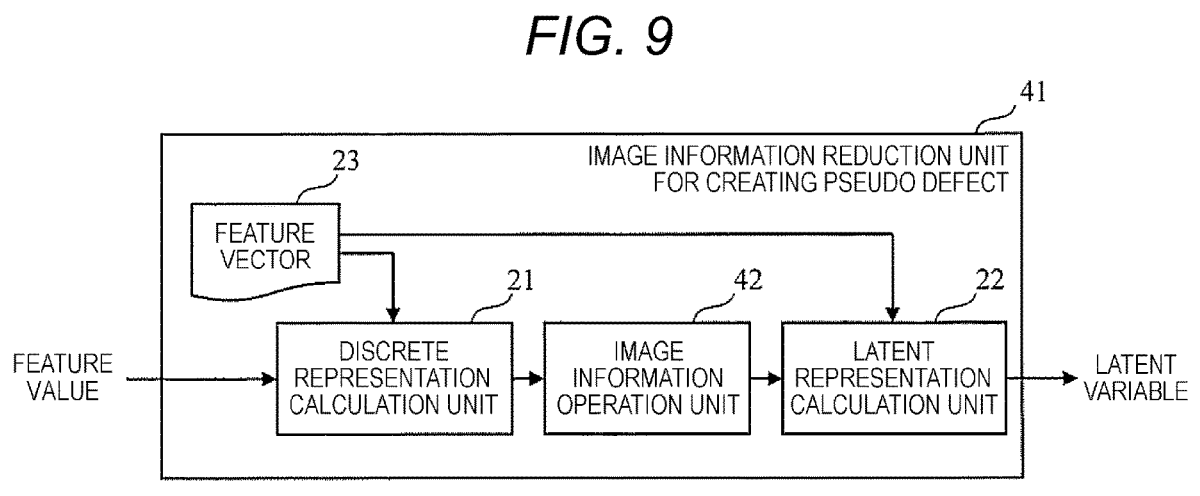

The configuration of the image information reduction unit 41 for creating pseudo defect is illustrated in FIG. 9. The image information reduction unit 41 for creating pseudo defect newly includes an image information operation unit 42 in addition to the internal configuration of the image information reduction unit 12.

A model parameter calculation method will be described using the learning flow of FIG. 10 together with the configuration diagrams of FIGS. 8 and 9.

Using the normal image 4 as a learning image, feature value calculation is performed by the feature value calculation unit 11 (S101). Then, based on the feature value related to the normal image 4, the discrete representation calculation unit 21 selects an index related to one feature vector 23 (first discrete representation) out of the indices of the plurality of feature vectors 23 (discrete representations). A discretized image is generated as a result (S102).

The value of the index of the discretized image is changed by the image information operation unit 42 (S201). The change can be made by, for example, randomly allocating the value of a certain index in the discretized image, filling a random region with a specific index, or copying one region to another.

As such, the image information reduction unit 41 for creating pseudo defect reduces the information quantity of a feature value related to the normal image 4 by replacing at least part of the feature value related to the normal image 4 with an index (second discrete representation) different from a selected index (first discrete representation).

A feature vector is embedded according to the index value (S103). Using the index value-operated discretized image, luminance value distribution estimation is performed as in FIGS. 3 and 4 (S104). The error between the estimated luminance value distribution and the normal image 4 is calculated by the model evaluation unit 31 (S105). The model parameter update quantity calculation unit 32 calculates a model parameter update quantity to reduce the obtained error (S106).

Figure 11:
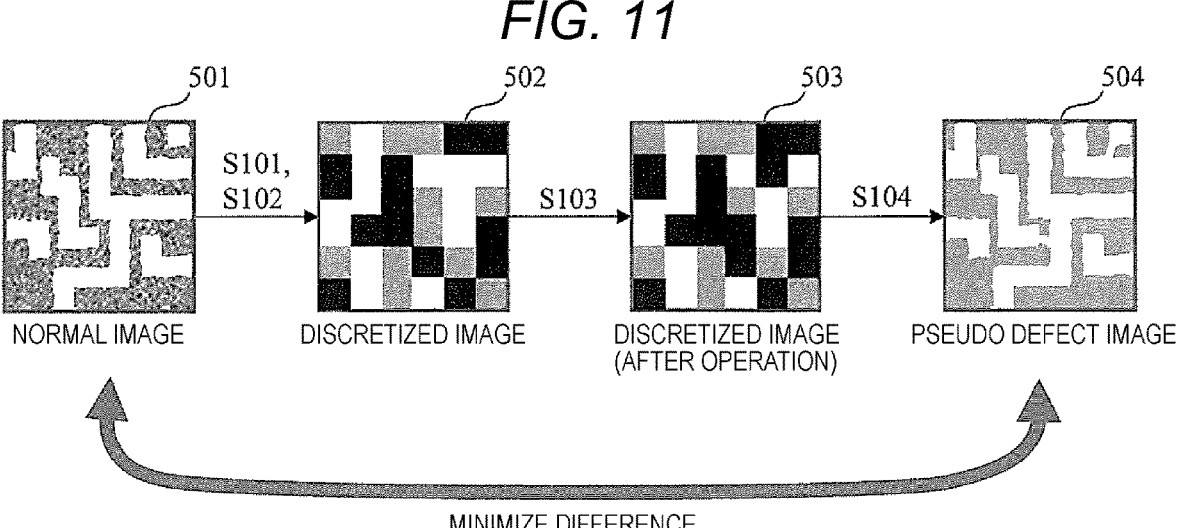
FIG. 11 is a schematic diagram illustrating an image generated in each step of the model parameter learning according to Example 3.

A schematic representation of the image generated in each step of the learning processing is illustrated in FIG. 11. Feature value calculation from a normal image 501 is performed (S101), and an information quantity-reduced discretized image 502 (illustrated conceptually) is generated by replacing the index of the feature vector 23 (S102). The discretized image 502 is operated by the image information operation unit 42.

A post-operation discretized image 503 (illustrated conceptually) in FIG. 11 is an example using a method for randomly allocating the value of a certain index in a discretized image. In a case where the allocated index is a feature regarding a semiconductor circuit pattern, the luminance value distribution estimated from the post-operation discretized image 503 becomes a pseudo defect image in which a circuit pattern feature is amplified as in the case of an image statistic value 504. By learning to reduce the difference between the pseudo defect image and the normal image 501, it is possible to search for the error-minimizing model parameter 10.

The effects of the example will be described. A pseudo defect image in which a certain defect is reproduced is generated by the image information operation unit 42 operating a discretized image. By searching for the model parameter 10 to minimize the difference between the pseudo defect image and the normal image and using the model parameter 10 in an inspection configuration as illustrated in FIG. 1 or 6, the statistic value estimation unit 13 is capable of more accurately estimating a luminance value distribution that can be taken by a captured image of a normal circuit from an inspection image including a defect. By detecting a defect by comparing the luminance value distribution with the inspection image 2, inspection throughput improvement is possible by making reference images unnecessary and reducing the time required to capture a reference image.

Example 4

Hereinafter, a defect inspection apparatus according to Example 4 of the invention will be described with reference to FIG. 12. In the following, description of parts common to Example 1 may be omitted.

Figure 12:
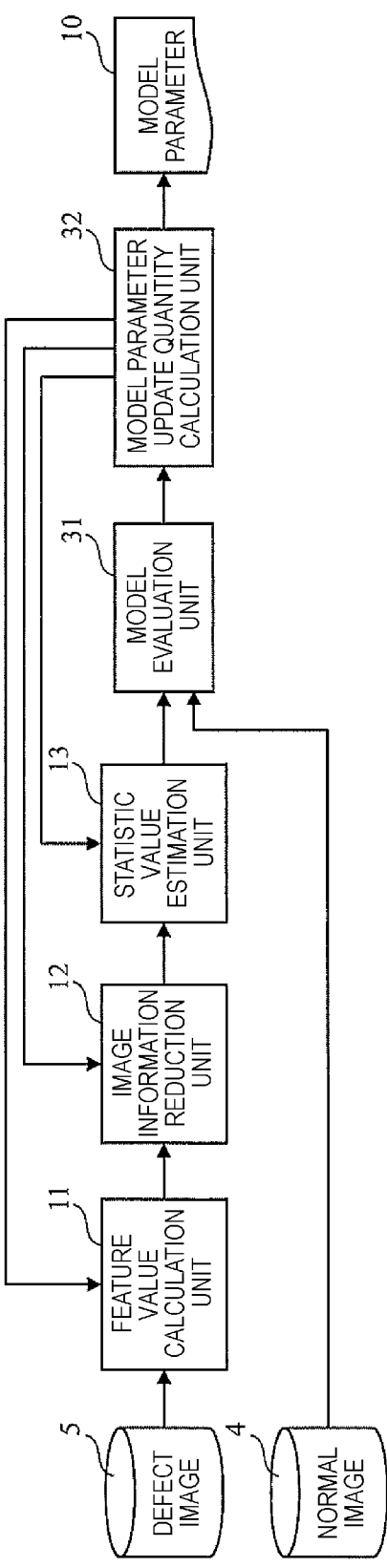
FIG. 12 is a configuration diagram of model parameter learning according to Example 4 of the invention.

Example 1 and Example 4 differ from each other in that the same learning image 3 is used for statistic value estimation and model evaluation as illustrated in FIG. 3 in Example 1 and a statistic value is estimated from a sample defect-including defect image 5 and the statistic value is compared with the sample defect-free normal image 4 as illustrated in FIG. 12 in Example 4.

In other words, in both Example 1 and Example 4, the model evaluation unit 31 performs error evaluation based on an image statistic value estimated based on a first learning image, which is a captured sample image, and a second learning image, which is a captured sample image. However, the first and second learning images are the same image (that is, learning image 3) in Example 1 whereas the first learning image is the sample defect-including defect image 5 and the second learning image is the normal image 4 of a normal sample in Example 4.

By learning to reduce the difference between the luminance value distribution estimated via the feature value calculation unit 11, the image information reduction unit 12, and the statistic value estimation unit 13 from the defect image 5 and the normal image 4, the error-minimizing model parameter 10 is retrieved. By using the model parameter 10 in an inspection configuration as illustrated in FIG. 1 or 6, inspection can be performed with the statistic value estimation unit 13 estimating a luminance value distribution that can be taken by a captured image of a normal circuit based on a defect-including inspection image.

The model parameter 10 search by means of the configuration of this example (FIG. 12) is particularly suitable in a case where a pair of a defect image and a normal image of another point with the same pattern is available. Note that the model parameter 10 search by means of the configuration of Example 1 (FIG. 3) may be suitable in a case where it is difficult to obtain such a pair.

Example 5

Figure 13:
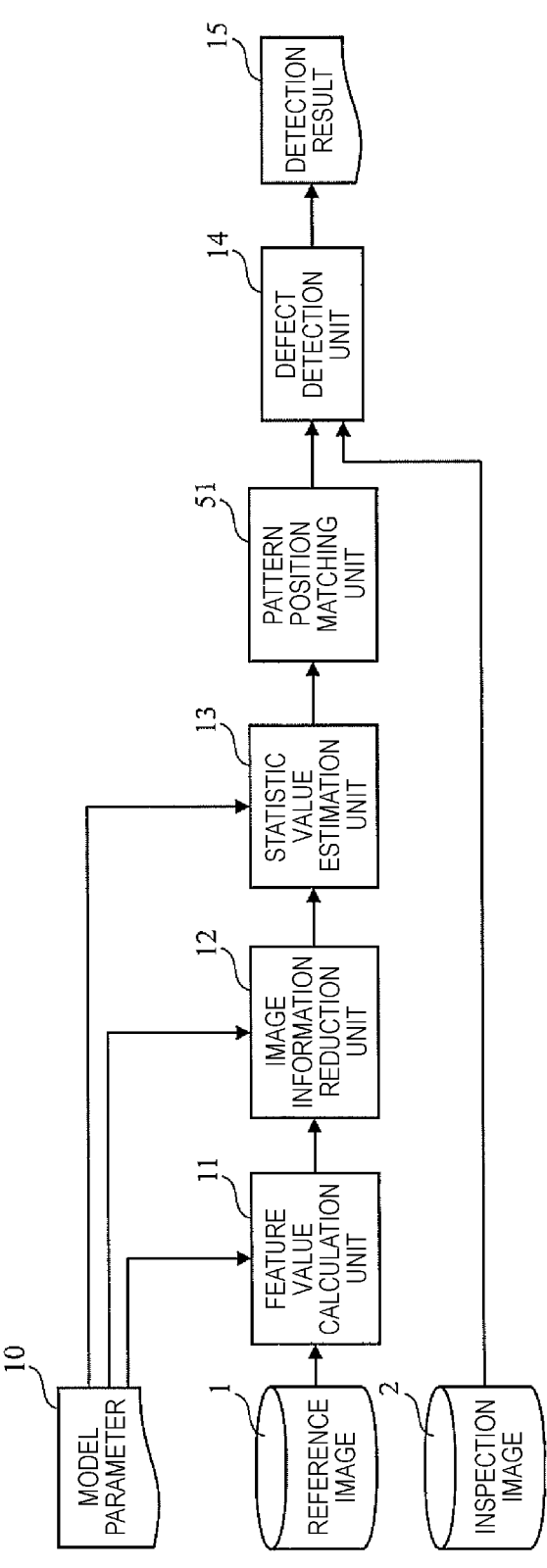
FIG. 13 is a configuration diagram of a defect inspection apparatus according to Example 5 of the invention.

Hereinafter, a defect inspection apparatus according to Example 5 of the invention will be described with reference to FIG. 13. In the following, description of parts common to Example 1 may be omitted.

Example 1 and Example 5 differ from each other in that the defect inspection apparatus newly includes a pattern position matching unit 51 in Example 5. The pattern position matching unit 51 aligns an image statistic value related to the reference image 1 with respect to the reference image 1 to correct a circuit position in a luminance value distribution estimated by the statistic value estimation unit 13 according to an inspection image. As a correction method, a pattern matching method for general image processing may be used or deep learning may be used to pre-learn a circuit pattern-matching deviation quantity. A defect is inspected by comparing the inspection image 2 with the post-position correction luminance value distribution.

The effects of the example will be described. In reducing information by discretizing a feature value of the reference image 1 in the image information reduction unit 12, semiconductor circuit position-related information may also be lost in part. Inspection performance improvement is possible by the pattern position matching unit 51 correcting the positional deviation of the luminance value distribution attributable to the positional information loss.

OTHER EXAMPLES

Although semiconductor defect inspection has been described as an example in each of the examples described above, the defect inspection apparatus according to each example is also applicable to image-based defect inspection and foreign matter detection in other industrial equipment.

What is claimed is:

1. A defect inspection apparatus for improving robustness to process and imaging variations and increasing inspection throughput by generating per-pixel normal-image statistics from a vector-quantized latent representation, the apparatus comprising:

an imaging subsystem configured to capture, from a sample, an inspection image; and one or more processors and a non-transitory memory storing instructions that, when executed by the one or more processors, cause the apparatus to:

compute, from a captured image of the sample, a feature representation;

generate a latent variable by reducing an information quantity of the feature representation, estimate, based on the latent variable, an image statistic value that can be taken by a normal image, and detect a defect in the inspection image based on the image statistic value and the inspection image of the sample.

2. The defect inspection apparatus according to claim 1, wherein the captured image is the inspection image.

3. The defect inspection apparatus according to claim 1, wherein generating the latent variable comprises reducing the information quantity of the feature representation by replacing at least part of the feature representation with at least one discrete representation selected from a plurality of discrete representations.

4. The defect inspection apparatus according to claim 3, wherein the plurality of discrete representations are entries of a learned codebook and the replacing comprises substituting, for respective spatial locations, indices identifying the entries.

5. The defect inspection apparatus according to claim 1, wherein the one or more processors are further configured to execute trained models whose parameters are learned by machine learning for the feature-representation computation, for the latent-variable generation, and for the image-statistic estimation, and wherein the one or more processors are further configured to:

evaluate an error based on an image statistic value estimated from a first learning image as a captured image of the sample and from a second learning image as a captured image of the sample, and calculate parameter update quantities for the trained models based on the error.

6. The defect inspection apparatus according to claim 5, wherein the one or more processors are configured to select, for the first learning image, a first discrete representation from among the plurality of discrete representations based on a feature representation related to the first learning image, and to reduce an information quantity of the feature representation related to the first learning image by replacing at least part of that feature representation with a second discrete representation different from the first discrete representation.

7. The defect inspection apparatus according to claim 5, wherein the first learning image and the second learning image are the same image.

8. The defect inspection apparatus according to claim 5, wherein the first learning image is a sample image including a defect and the second learning image is an image of a normal sample.

9. The defect inspection apparatus according to claim 5, wherein generating training data further comprises creating a pseudo-defect learning image by operating indices of the latent variable and using the pseudo-defect learning image for model training together with a corresponding normal image.

10. The defect inspection apparatus according to claim 1, further comprising one or more processors configured to perform pattern position matching to align the image statistic value related to the captured image with respect to the captured image.

11. The defect inspection apparatus according to claim 1, wherein generating the latent variable includes deleting intra-image noise and manufacturing-error-related information from the feature representation.

12. The defect inspection apparatus according to claim 1, wherein generating the latent variable does not delete information related to intra-image distortion, luminance unevenness, or defocusing from the feature representation.

13. The defect inspection apparatus according to claim 1, wherein the image statistic value comprises, for each pixel, at least one of a central-tendency value and a dispersion value predicted for a normal image.

14. The defect inspection apparatus according to claim 1, wherein the apparatus operates without design data of the sample and without using a separate reference image.

\* \* \* \* \*